United States Patent
Barth et al.

(10) Patent No.: US 7,440,334 B2
(45) Date of Patent: Oct. 21, 2008

(54) MULTI-TRANSISTOR MEMORY CELLS

(75) Inventors: Hans-Joachim Barth, München (DE);
Alexander Olbrich, Hohenbrunn (DE);
Martin Ostermayr, Feldkirchen (DE);
Klaus Schrüfer, Baldham (DE)

(73) Assignee: Infineon Technologies, Munich (DE)

( * ) Notice: Subject to any disclaimer, the term of this patent is extended or adjusted under 35 U.S.C. 154(b) by 156 days.

(21) Appl. No.: 11/387,490

(22) Filed: Mar. 23, 2006

(65) Prior Publication Data

US 2006/0164876 A1    Jul. 27, 2006

Related U.S. Application Data

(63) Continuation of application No. PCT/EP2004/052184, filed on Sep. 15, 2004.

(30) Foreign Application Priority Data

Sep. 25, 2003    (DE) ................. 103 44 604

(51) Int. Cl.
*G11C 11/34*    (2006.01)
(52) U.S. Cl. .................... 365/188; 365/149
(58) Field of Classification Search .............. 365/188
See application file for complete search history.

(56) References Cited

U.S. PATENT DOCUMENTS

| | | | |
|---|---|---|---|
| 4,935,896 A * | 6/1990 | Matsumura et al. | 365/187 |
| 5,605,858 A | 2/1997 | Nishioka et al. | |
| 5,646,903 A * | 7/1997 | Johnson | 365/230.05 |
| 5,841,690 A * | 11/1998 | Shibutani et al. | 365/149 |
| 6,075,265 A * | 6/2000 | Goebel et al. | 257/296 |
| 6,087,692 A * | 7/2000 | Gobel et al. | 257/300 |
| 6,239,460 B1 * | 5/2001 | Kuroiwa et al. | 257/300 |
| 6,329,264 B1 | 12/2001 | Wu | |
| 6,420,191 B2 * | 7/2002 | Kuroiwa et al. | 438/3 |
| 6,804,142 B2 * | 10/2004 | Forbes | 365/149 |
| 6,982,897 B2 * | 1/2006 | Luk et al. | 365/149 |
| 7,027,326 B2 * | 4/2006 | Luk et al. | 365/175 |
| 2004/0027873 A1 | 2/2004 | Nishihara | |
| 2004/0264279 A1 * | 12/2004 | Wordeman et al. | 365/230.05 |
| 2005/0073871 A1 * | 4/2005 | Luk et al. | 365/149 |

FOREIGN PATENT DOCUMENTS

| | | |
|---|---|---|
| DE | 195 36 528 A1 | 4/1997 |
| JP | 2003178578 | 6/2003 |
| WO | WO 01/84604 A2 | 11/2001 |

* cited by examiner

*Primary Examiner*—Son L Mai
(74) *Attorney, Agent, or Firm*—Brinks Hofer Gilson & Lione

(57) ABSTRACT

A memory cell having three transistors and a capacitor having metallic electrodes is described. Multiple memory cells may be arranged in a memory unit or array. Collective electrodes may be used in a space-saving embodiment of the capacitor.

32 Claims, 7 Drawing Sheets

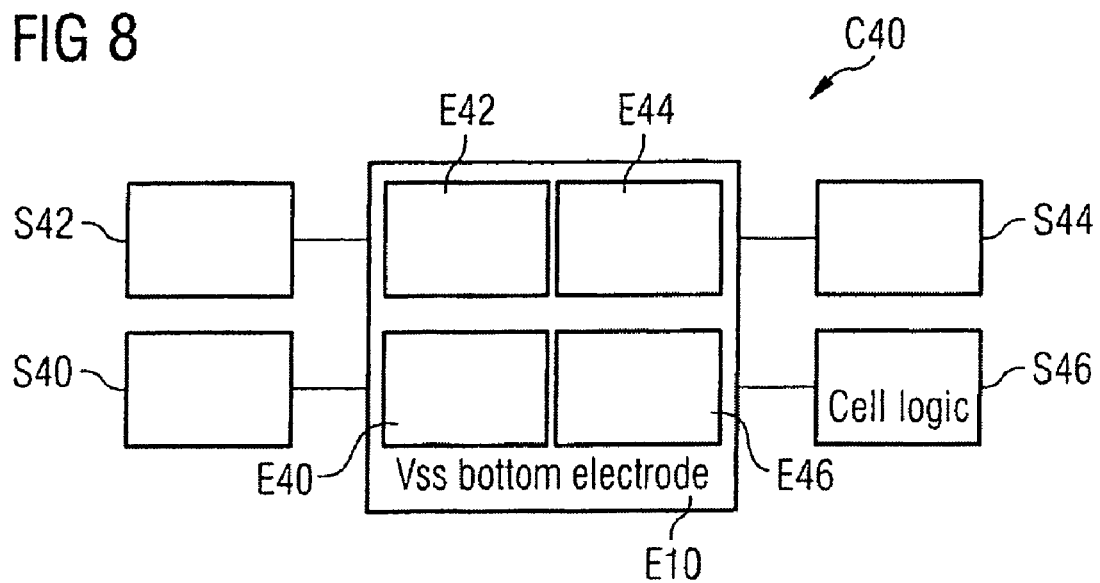
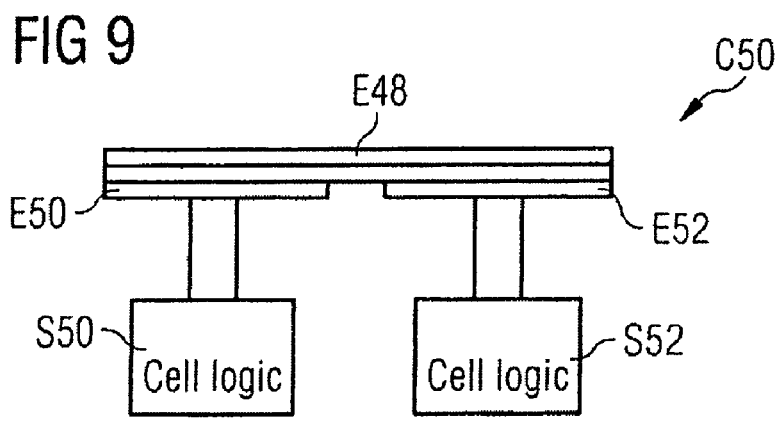

MULTI-TRANSISTOR MEMORY CELLS

PRIORITY AND CROSS REFERENCE TO RELATED APPLICATION

This application is a continuation of International Application No. PCT/EP2004/052184, filed Sep. 15, 2004, which claims priority to German application 103 44 604.4, filed Sep. 25, 2003, both of which are incorporated in their entirety by reference herein.

BACKGROUND OF THE INVENTION

1. Field of the Invention

The invention relates to a memory cell having multiple transistors and at least one storage capacitor, and in particular to a memory cell having three field-effect transistors (FET's).

2. Description of the Related Art

Memory units may include a charge storage unit, such as a capacitive component. Data may be represented as a charge or absence of charge in the charge storage unit. A leakage current may drain a charge stored in the charge storage unit. To compensate for leakage, the charge may be repeatedly and/or periodically refreshed. A refresh may include providing a current to the charge storage unit to build up the charge in the charge storage device. Memory units for which a clock signal for the refresh depends on a clock signal of a processor externally arranged from the memory unit may be referred to as dynamic random access memories (DRAM's). Where a clock signal for the refresh is generated by logic arranged on the same chip or with the memory may be referred to as an embedded DRAM or a pseudo-static read only memory (SRAM).

The memory unit may include a switch, such as a transistor, by which the charge storage device may be accessed. Data from a memory unit may be read by switching the transistor to determine whether charge is present in the charge storage device. Charge in the charge storage unit may also be drained during a read cycle.

Memory units having multiple transistors have been developed. However, such devices may not have a desirable reliability for reading data, or may take a larger area on a memory layout. Existing multi-transistor memory units may consume large amounts of power, take up large areas in a layout and have small fabrication yield. Existing three-transistor memory cells have capacitors with an electrode in the substrate and an electrode made of polycrystalline material. Other memory units include a complex stacked capacitor in a polycrystalline material directly above the substrate. Accordingly, the existing memory units having multiple transistors have a complex architecture that may be difficult to produce and have poor electrical properties.

Therefore, there is a need for a multi-transistor memory unit that may be constructed in a simple manner that is simple to produce with good electrical properties and a small layout area.

SUMMARY OF THE INVENTION

The present invention includes a memory cell having a simple architecture that may be constructed in a simple manner. The memory unit provides desirable electrical properties, uses small area layout, and consumes a low amount of power. A memory unit of the present invention may also be manufactured with a high fabrication yield.

The storage capacitor of the memory cell according to the present invention includes one or more electrode. In an embodiment, each of the electrodes is metallic. The metallic electrodes may be arranged in a metallization layer (i.e., above the transistors of the memory cell). The metallic electrodes have better electrical properties than polycrystalline and monocrystalline semiconductor electrodes, in particular with regard to the electrical conductivity. Thus, the area per memory cell is relatively small or reduced.

Regions of the transistors, such as channel regions, may be arranged in a semiconductor substrate such as a silicon substrate material. The electrodes may be positioned at mutually different distances from the substrate part containing the regions of the transistors. The electrodes of the capacitor may also be arranged parallel to one another and parallel to a substrate surface region of the memory cell.

In an embodiment, the memory cell includes, with increasing distance from the substrate part, in the order specified: 1) a first electrode; 2) a second electrode; 3) a third electrode; and 4) a fourth electrode. Two or more capacitor electrode pairs are thus arranged one above another. Thus, the chip area for a memory cell has a reduced dependency on the total capacitance of the storage capacitor. The first electrode and the third electrode may be electrically conductively connected to one another to form an electrode group. The second electrode and the fourth electrode are likewise electrically conductively connected to one another to form a further electrode group. Accordingly, a simple-to-connect arrangement of intermeshing electrode groups is provided. When the electrodes of an electrode group have an identical thickness and the electrodes of different electrode groups have different thicknesses, then the storage capacitor may have desirable electrical properties, particularly when thinner electrodes are connected to a constant potential. Electrodes having different thicknesses are preferred particularly when the electrodes are arranged in different metallization layers.

In an embodiment, the storage capacitor includes at least two metallic electrodes arranged between two mutually adjacent metallization layers, such as between planar metallization layers. The storage capacitor with at least two metallic electrodes arranged between two mutually adjacent metallization layers may be combined with stacking electrodes one above another in different metallization layers, to increase the total area capacitance of the capacitor.

The metallic electrode may be a pure metal or include more than 50 percent by weight of atoms of a metal. The metal may be titanium nitride, tantalum nitride, tantalum, titanium, tungsten nitride, aluminum, aluminum alloy, copper, copper alloy, tungsten, gold or silver and combinations thereof. The electrodes may have a square or rectangular contour or cross-section. In particular, there are no convex corners to partial regions of the electrodes whose area amounts to more than ten percent of the square or rectangular contour area. The electrodes having the simple basic form are simple to produce and have low leakage currents.

A capacitor dielectric may include silicon oxide, such as silicon dioxide, silicon nitride, silicon carbide, aluminum oxide, aluminum trioxide, tantalum oxide, tantalum pentoxide, hafnium oxide, hafnium dioxide, zirconium oxide, zirconium dioxide, lead zirconate titanate, barium strontium titanate. Many of these materials have a relative permittivity of greater than 8. In connection with a thickness of the capacitor dielectric in the range of 50 nm to 5 nm, it is possible even with a pair of plates to obtain high area capacitance values (e.g. greater than 2 fF/$\mu$m 2 (femtofarad per square micrometer). In an embodiment, the capacitance of the capacitor may be in the range of about 10 fF to about 0.5 fF. In another embodiment, the capacitance may be about 1 fF.

The capacitor may include not only an electrode area or electrode partial area lying parallel to a substrate, but also at least one electrode area or electrode partial area arranged transversely with respect to the substrate and which contributes substantially to the total capacitance. Thus, by way of example, at least ten percent of the capacitance is provided by transverse electrode areas. Such a U-shaped or V-shaped electrode is explained e.g. in the European patent application EP 1277229, which is incorporated in its entirety by reference herein.

In an embodiment, a conductive section for lateral current transport within the metallization layer in which the conductive section is arranged is provided between the storage capacitor and the substrate. An electrically conductive connection lies between the conductive section and a connection of a transistor. A further electrically conductive connection lies between the conductive section and a connection of another transistor of the memory cell. There is preferably a single electrically conductive connection between the conductive section and the capacitor. The conductive section enables a reliable connection of two transistors to the storage capacitor.

A memory unit according to the invention includes multiple memory cells, each having multiple transistors according to the invention and developments therefrom. The above-mentioned technical effects thus also apply to a memory unit.

In an embodiment of a memory unit, electrodes for different memory cells are formed as a collective electrode. The collective electrode is formed in a word line direction as an electrode for a plurality of memory cells on different bit lines. In the bit line direction, the collective electrode is not assigned a plurality of memory cells. Alternatively, the collective electrode is formed in a bit line direction as an electrode for a plurality of memory cells on different word lines and the collective electrode is not assigned a plurality of memory cells in the word line direction. Thus degrees of freedom for the design may be achieved and specific circuitry requirements fulfilled more easily.

In another embodiment for a memory unit, the collective electrode is formed as an electrode both in a word line direction for memory cells on a plurality of bit lines and in a bit line direction for memory cells on a plurality of word lines (e.g., for some of the memory cells of the memory unit but not for all of the memory cells of the memory unit). The number of word lines associated with the collective electrode is equal to the bit width of a word line decoder. Alternatively, the number of bit lines associated with the collective electrode is equal to the bit width of a bit line decoder of the memory unit. Accordingly, current consumption may be reduced, particularly when the memory cells on a word line are connected to a plurality of bit line decoders or the memory cells on a bit line are connected to a plurality of word line decoders.

The collective electrode is preferably connected outside a memory cell array for a plurality of memory cells, without local electrically conductive connections existing for individual memory cells to relieve a burden on the design in the memory cell array. Alternatively, the collective electrode includes at least one connection for each memory cell, resulting in a good contact-connection and a uniform potential at the collective electrode.

In a next development, the storage capacitors for all the memory cells are arranged at—among one another—a substantially identical distance from the transistors of the relevant memory cell, and preferably in the same metallization layers. A number of production steps is thus reduced. Alternatively, the storage capacitors for different memory cells are arranged at—among one another—a different distance from the transistors of the relevant memory cell, and preferably in different metallization layers. Accordingly, the capacitors of mutually adjacent memory cells may be arranged in overlapping fashion, and the layout area decreased. The design may be applied both to capacitors having only one pair of electrodes and to capacitors having more than two electrodes.

In another embodiment, a capacitor of a memory cell is arranged closer to a semiconductor substrate of the memory unit than a bit line for driving the memory cell. The capacitor can thereby be connected more simply. As an alternative, the capacitor of a memory cell is arranged further away from the semiconductor substrate than the bit line. Cutouts in the electrodes of the capacitor for the connection of the bit line can be obviated in this case.

DESCRIPTION OF THE DRAWINGS

Exemplary embodiments of the invention are explained below with reference to the accompanying drawings. Identical, functionally identical, or similar elements and signals are referred to with the same reference symbols in the figures unless stated otherwise.

FIG. 8 shows a plan view of an exemplary embodiment with a bottom collective electrode.

FIG. 9 shows a cross section through an exemplary embodiment with a top collective electrode.

DESCRIPTION OF THE PREFERRED EMBODIMENTS

Figure 1:
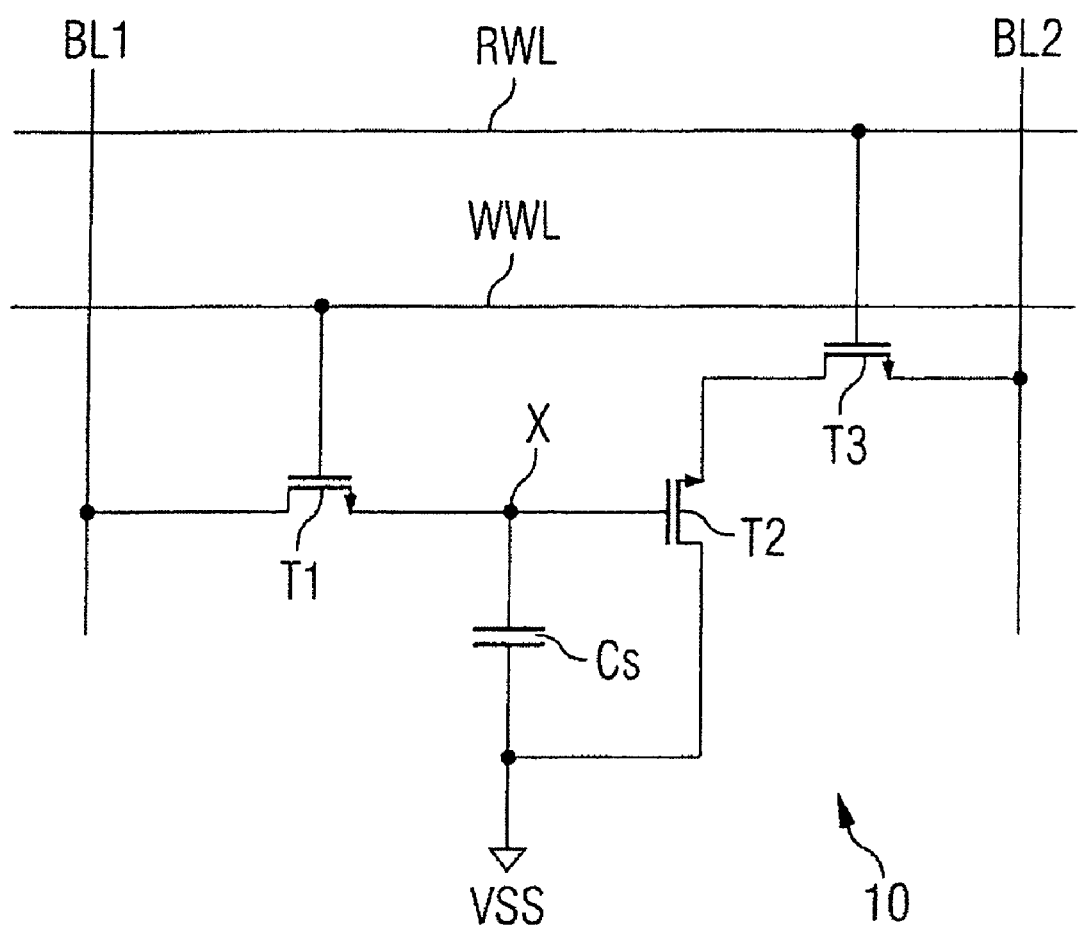
FIG. 1 shows a three-transistor memory cell.

FIG. 1 shows a circuit diagram of a memory cell 10 having three transistors T1 to T3 and a capacitor Cs. In the exemplary embodiment, the transistors T1 to T3 are n-channel transistors. The capacitor Cs may be a metal insulator metal ("MIM") capacitor. The circuit of the memory cell 10 includes a subcircuit for writing and a subcircuit for reading. The charge of the capacitor Cs is not altered during reading, so that there is no need either for the charge to be refreshed after a reading operation.

The subcircuit for writing includes the writing transistor T1 and the capacitor Cs. A gate of the transistor T1 is connected to a writing word line WWL. A drain of the transistor T1 is connected to a writing bit line BL1. The source connection of the transistor T1 leads to a memory node X formed by an electrode of the capacitor Cs. The other electrode of the capacitor Cs is at a ground potential VSS.

The subcircuit for reading includes transistors T2 and T3. A gate of the transistor T3 is connected to a reading word line RWL. Word lines are thus connected to a gate connection of a transistor T1 or T3. A source of the transistor T3 is connected to a reading bit line BL2, which is charged to an operating potential VDD. The reading bit line BL2 may be charged to an operating potential before the beginning of the reading operation. A drain of the transistor T3 is connected to one source connection of the transistor T2. A gate of the transistor T2 is connected to the memory node X. A drain of the transistor T2 is at the ground potential VSS.

The transistor T2 may be an amplifier. As an amplifier, transistor T2 provides for reliable reading, such as in the event of charge losses at memory node X. When a positive charge is placed on the memory node X, then the transistor T2 is in the switched-on state, and the precharged reading bit line BL2 is discharged during the reading operation.

Figure 2:
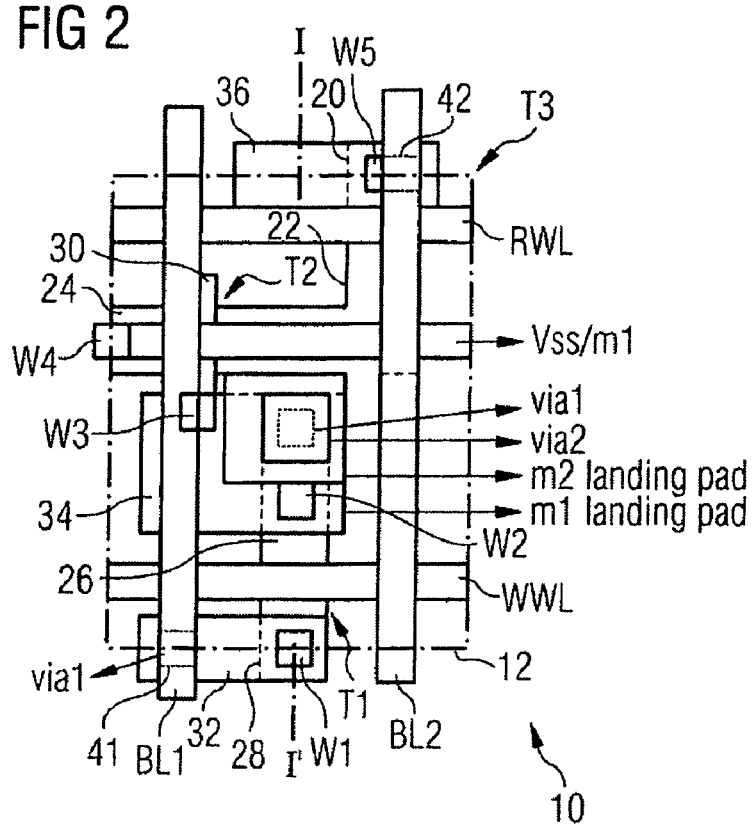
FIG. 2 shows a plan view of a layout of the memory cell.
Figure 3:
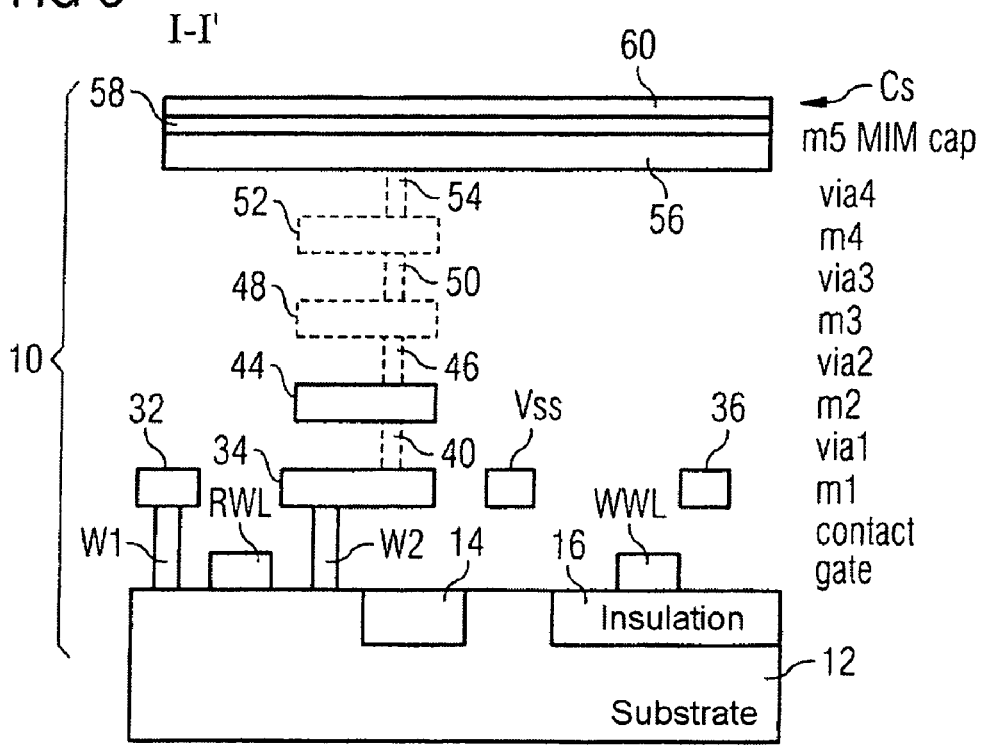
FIG. 3 shows a cross section through I-I of the layout of the memory cell shown in FIG. 2.

FIG. 2 shows a plan view of a layout of the memory cell 10. FIG. 3 shows a cross section through I-I of the layout of the memory cell 10. The memory cell 10 is produced proceeding from a silicon substrate 12. The substrate 12 includes insulation regions 14, 16. The substrate 12 may also include n-doped channel connection zones of the transistors T1 to T3, such as:

a source region 20 of the transistor T3,
a doping region 22, which forms the drain region of the transistor T3 and the source region of the transistor T2,
a drain region 24 of the transistor T2,
a source region 26 of the transistor T1, and
a drain region 28 of the transistor T1.

With increasing distance from the substrate 12, the following may be arranged in the memory cell:

in a plane "gate", the reading word line RWL, the writing word line WWL and the gate 30 of the transistor T2, all having of a polycrystalline silicon,
in a plane "contact", contacts W1 to W5, for example made of tungsten, the contact W1 leading to the drain region 28, the contact W2 leading to the source region 26, the contact W3 leading to the gate 30, the contact W4 leading to the drain region 24 and the contact W5 leading to the source region 20,
in a planar metallization layer m1, a pad 32 (landing pad) connected to the contact W1, a pad 34 connected to the contacts W2 and W3, a ground line Vss made of e.g. copper or made of a copper alloy, which runs in the word line direction and is connected to the contact W4, and a pad 36 connected to the contact W5, the pads comprising e.g. copper or a copper alloy,
a via layer via 1 having a via 40 leading to the pad 34, a via 41 leading to the pad 32, and a via 42 leading to the pad 36,
a planar metallization layer m2 containing a pad 44 connected to the via 40, and also containing the writing bit line BL1 and the reading bit line BL2, the writing bit line BL1 being connected to the via 41 and the reading bit line BL2 being connected to the via 42,
a via layer via 2 containing a via 46 leading to the pad 44,
a planar metallization layer m3 containing a pad 48 connected to the via 46,
a via layer via 3 containing a via 50 leading to the pad 48,
a metallization layer m4 containing a pad 52 connected to the via 50,
a via layer via 4 containing a via 54 connected to the pad 52, and
a metallization layer m5 containing a bottom electrode of the capacitor Cs.

The vias 40 to 54 may include copper or a copper alloy. To produce the metallization, multiple single damascene or dual damascene methods may be used in which, after the copper deposition, planarization is effected in each case using a chemical mechanical polishing ("CMP") method. The metallization layer m5 may additionally include a capacitor dielectric 58 adjoining the bottom electrode 56 and a top electrode 60 of the capacitor Cs, where the top electrode is arranged on the capacitor dielectric 58.

Figure 4:
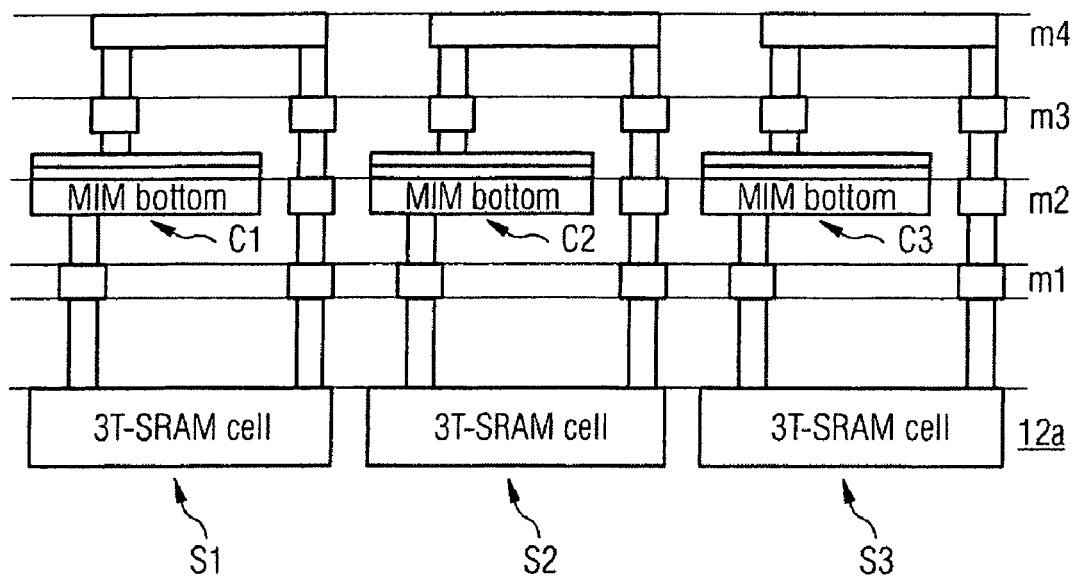
FIG. 4 shows an exemplary embodiment with storage capacitors arranged in one plane.

FIG. 4 shows an exemplary embodiment with storage capacitors C1 to C3 arranged in a plane and associated in an order of three-transistor memory cells S1, S2 and S3, respectively. The three-transistor memory cells S1, S2, and S3 may be are constructed similar to the memory cell 10 apart from the discrepancies explained below. Bottom electrodes of the capacitors C1 to C3 are arranged for example in the metallization layer m2 and the bit lines BL1 and BL2 are routed in the metallization layer m3.

The bottom electrodes of the capacitors C1 to C3 may be connected from below. For example a connection that lies only within the metallization layers between the relevant capacitor C1 to C3 and a substrate 12a may be provided. By contrast, the top electrodes of the capacitors C1 to C3 are connected from above for each memory cell S1 to S3. The relevant connection may lead as far as the substrate 12a and run through the metallization layers m1 to m4. The memory cells S1 to S3 may lie on the same word lines or on the same bit lines. In an exemplary embodiment, the bottom electrodes of the capacitors C1 to C3 are thicker than the top electrodes of the capacitors C1 to C3.

Figure 5:
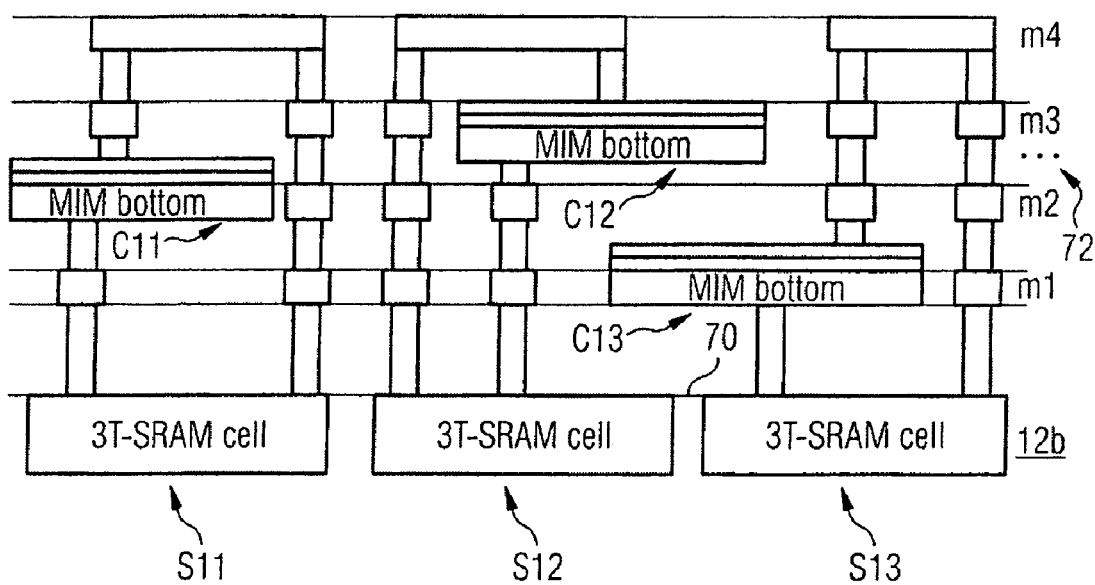
FIG. 5 shows an exemplary embodiment with storage capacitors arranged in a plurality of planes.

FIG. 5 shows an exemplary embodiment with storage capacitors C11, C12 and C13 arranged in multiple planes and associated in order with three-transistor memory cells S11, S12 and S13, respectively. The transistor memory cells S11, S12, and S13 are constructed similar to the memory cell 10 apart from the differences described herein. In an exemplary embodiment, the bottom electrode of the capacitor C11 lies in the metallization layer m2. The bottom electrode of the capacitor C12 lies in the metallization layer m3. The bottom electrode of the capacitor C13 lies in the metallization layer m1, such as in the metallization layer that is at the least distance from a substrate 12c.

The bottom electrodes of the capacitors C11 to C13 are connected from below, such as by a connection that lies only within the metallization layers between the relevant capacitor C11 to C13 and the substrate 12b. By contrast, the top electrodes of the capacitors C11 to C13 are connected from above for each memory cell S11 to S13, where the relevant connection leads as far as the substrate 12b and running through the metallization layers m1 to m4. The memory cells S11 to S13 may lie on the same word lines or on the same bit lines. The bottom electrodes of the capacitors C11 to C13 may be thicker than the top electrodes of the capacitors C11 to C13. The capacitors C12 and C13 are arranged in a manner overlapping one another in a direction of the normal to a surface 70 of the substrate 12b, so that they in each case also overlap an area of the substrate which is associated with the other memory cell. The arrangement of three types of memory cells S11 to S13 as illustrated in FIG. 5 is continued toward the left in another exemplary embodiment (e.g., dots 72), thereby giving rise to a sequence m2, m3, m1, m2, m3 etc. of the bottom electrodes in the metallization layers. Other sequences are used in other exemplary embodiments.

Figure 6:
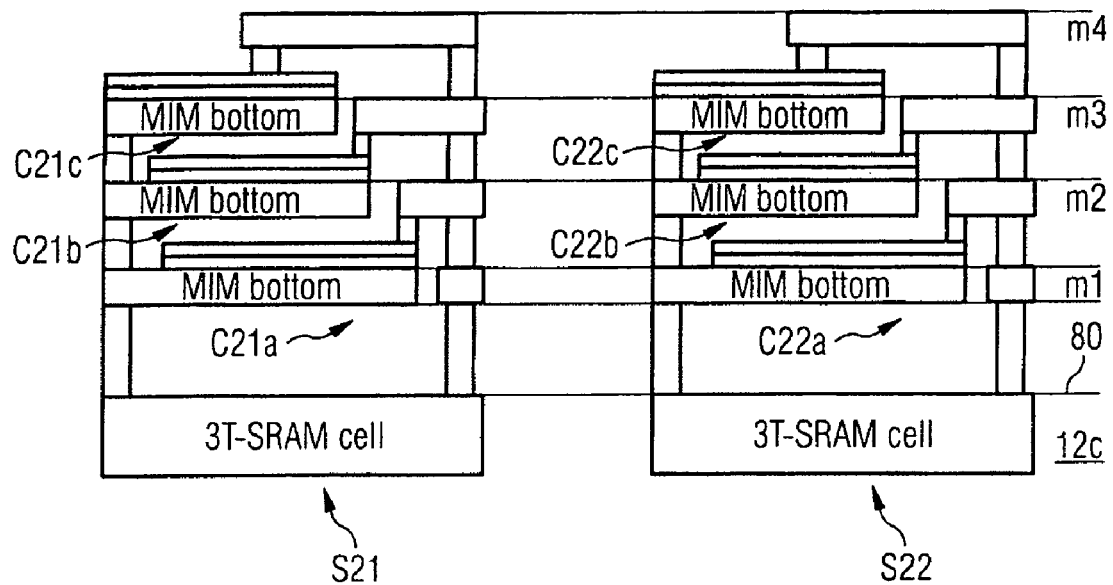
FIG. 6 shows an exemplary embodiment with individual capacitors connected in parallel.

FIG. 6 shows an exemplary embodiment with three parallel-connected individual capacitors C21a to C21c and C22a to C22c per memory cell S21 and S22, respectively. The memory cells S21 and S22 may be constructed like the memory cell 10 apart from the differences described below. For simplifying the description, only the construction of the memory cell S21 is explained herein.

In the exemplary embodiment, the bottom electrode of the capacitor C21a lies in the metallization layer m1. The bottom electrode of the capacitor C21b lies in the metallization layer m2. The bottom electrode of the capacitor C21c lies in the metallization layer m3, such as in the metallization layer that is at the greatest distance from a substrate 12c. The capacitors of the memory cell S21 are arranged in a manner overlapping one another with regard to the direction of the normal to a surface 80 of the substrate 12c, a uniform offset preferably occurring between adjacent capacitors.

The bottom electrodes of the capacitors C21a to C21c are connected from below, such as by a connection that lies only within the metallization layers between the relevant capacitor C21a to C21c and the substrate 12b. By contrast, the top electrodes of the capacitors C21a to C21c are connected from above, the relevant connection leading as far as the substrate 12c. The memory cells S21 and S22 may lie on the same word lines or on the same bit lines. In the exemplary embodiment, the bottom electrodes of the capacitors C21a to C22c are thicker than the top electrodes of the capacitors C21a to C22c. The arrangement shown with reference to FIG. 6 results in a higher capacitance over the basic area predefined per memory cell S21, S22. As an alternative to the planar capacitors in accordance with FIGS. 4-6, U-shaped or V-shaped MIM capacitors are used in other exemplary embodiments.

Figure 7:
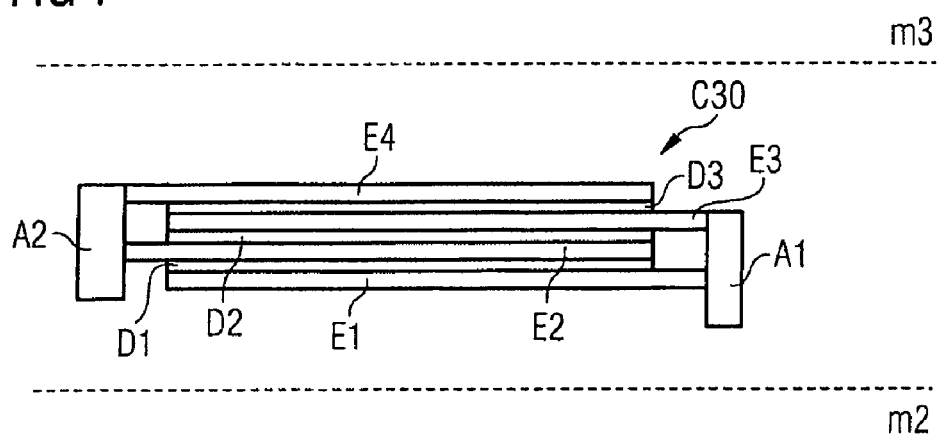
FIG. 7 shows an exemplary embodiment with a multilayer capacitor.

FIG. 7 shows an exemplary embodiment with a multilayer capacitor C30 that is used in place of the capacitors C1 to C22c shown in FIGS. 4-6. Multiple metallic electrodes E1 to E4 may lie between two metallization layers, such as between the metallization layers m2 and m3. The bottom electrode E1 and the upper middle electrode E3 form an electrode pair E1, E3 having electrically conductively interconnected electrodes. The lower middle electrode E2 and the topmost electrode E4 form a further electrode pair E2, E4, which likewise includes connected electrodes E2 and E4. The electrode pair E1, E3 is connected to one connection A1 of the capacitor C30. The electrode pair E2, E4 is connected to the other connection A2 of the capacitor. The electrodes of the electrode pairs may alternate between two metallization layers with increasing distance from the substrate. Lying between adjacent electrodes is a thin dielectric D1 to D3, etc. The thin dielectric may be a material having a relative permittivity of greater than 8. In another exemplary embodiment, the bottom electrode of the capacitor C30 is made thicker in the metallization layer m3 than the electrode adjoining above the latter. A thick electrode in the metallization layer m3 may also be included with the capacitor C30.

The connection of the electrodes of the capacitor can be effected from the substrate, as illustrated in FIG. 7. However, in another exemplary embodiment, the electrodes E1 to E4 are connected from "above", such as at their sides remote from the substrate. In a next exemplary embodiment, the electrodes of an electrode pair may be connected at mutually different sides, such as from "above." In further exemplary embodiments, the capacitor C30 includes only three electrodes or more than four electrodes (e.g., five, six seven or more electrodes).

FIG. 8 shows a plan view of an exemplary embodiment with a capacitor C40 having a bottom collective electrode E10 for multiple memory cells S40 to S46, such as for four memory cells that are each constructed similar to the memory cell 10 except for the differences explained below. The collective electrode E10 carries ground potential Vss. The capacitor C40 has a plurality of top electrodes E40, E42, E44 and E46 assigned in this order to the memory cells S40, S42, S44 and S46. The memory cells S42 to S46 are arranged alongside the capacitor C40. For example, the memory cells S42 to S46 are arranged in a lateral direction relative to the active surface of a substrate. The arrangement shown in FIG. 8 also enables a space-saving MIM capacitor to be produced. In particular, the bottom electrode may be connected outside the cell array.

FIG. 9 shows a cross section through an exemplary embodiment with a capacitor containing a top collective electrode E48 and a plurality of bottom electrodes E50 and E52 that are assigned in this order to two memory cells S50 and S52, respectively. The memory cells 50 and 52 are in each case constructed like the memory cell 10 apart from the differences explained. The arrangement illustrated in FIG. 9 enables a space-saving MIM capacitor to be produced. In particular, the top electrode E48 may be connected outside the cell array.

The collective electrodes illustrated in FIGS. 8 and 9 may be assigned to multiple memory cells in the word line direction or in the bit line direction. In each case, the memory cells driven by a writing word line or reading word line, or the memory cells driven by a writing bit line or reading bit line being may be assigned to the collective electrode. Multiple memory cells may be arranged on a collective electrode both in the word line direction and in the bit line direction (see e.g., FIG. 8 or FIGS. 9 and 10 explained below).

Figure 10:
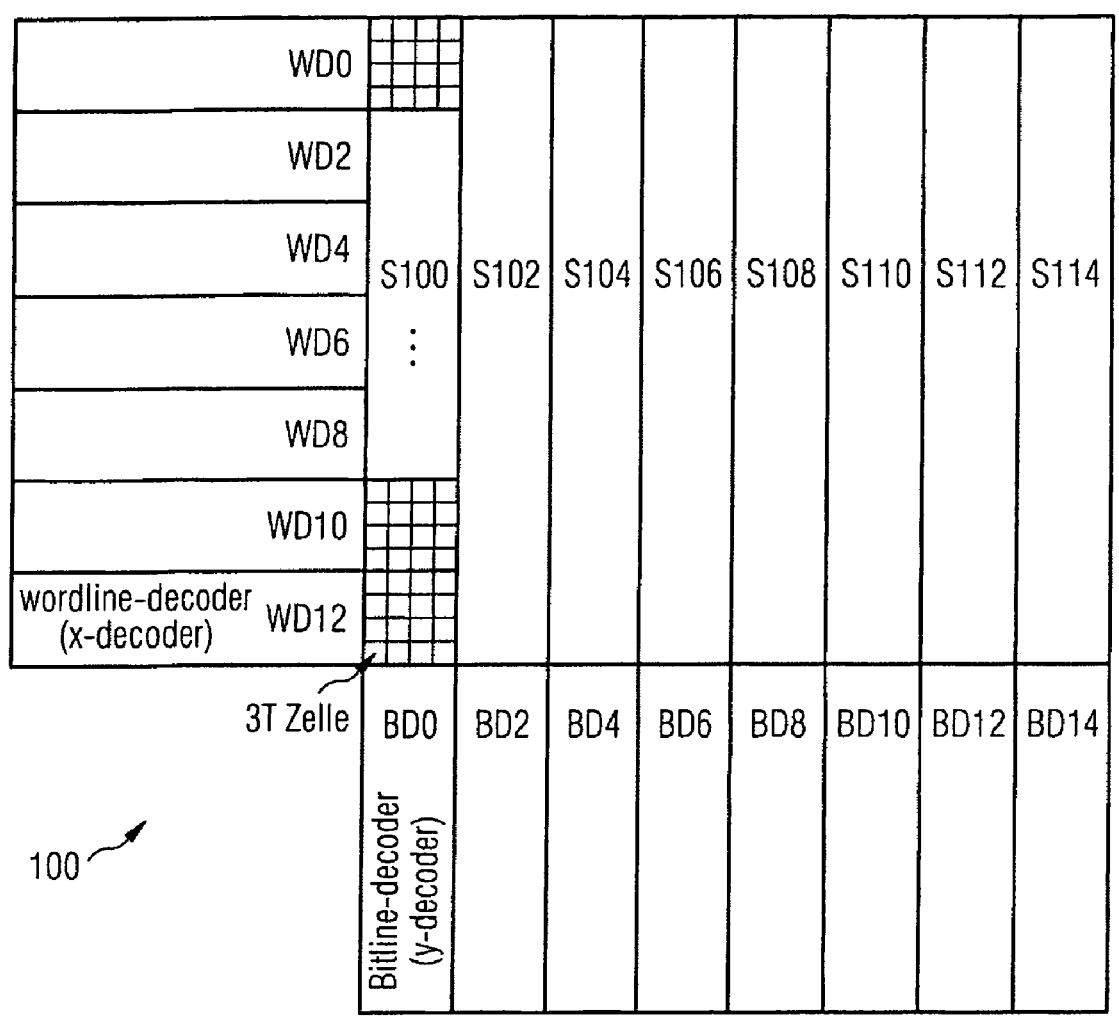
FIG. 10 shows an exemplary embodiment with a plurality of collective electrodes.

FIG. 10 shows a memory unit 100 having eight collective electrodes S100 to S114 that are respectively assigned to one of eight bit line decoders BD0 to BD14. A collective electrode S100 to S114 extends over three-transistor memory cells assigned to seven different word line decoders WD0 to WD12. The bit width of the bit line decoders BD0 to BD14 and of the word line decoders WD0 to WD12 is four bits in the exemplary embodiment. Consequently, 112 memory cells lie below a collective electrode in the exemplary embodiment. Multiplexers that are not illustrated ensure that, depending on an address datum, only in each case one bit line decoder BD0 to BD14 and only in each case one word line decoder WD0 to WD12 are active.

In other exemplary embodiments, the memory unit 100 may have a different organizational structure, such as a different number of word line decoders or bit line decoders, or a different bit width of the decoders. In other exemplary embodiments, the bit width may be two bits, eight bits, sixteen bits or more.

The assignment of the collective electrodes S100 to S114 to a respective bit line decoder BD0 to BD14 allows a considerable reduction of the current consumption of the memory unit 100 when a potential is applied only to that collective electrode S100 to S114 having a bit line decoder BD0 to BD14 that is currently selected. By contrast, the non-selected collective electrodes BD0 to BD14 are not connected to the operating potential or the ground potential.

Figure 11:
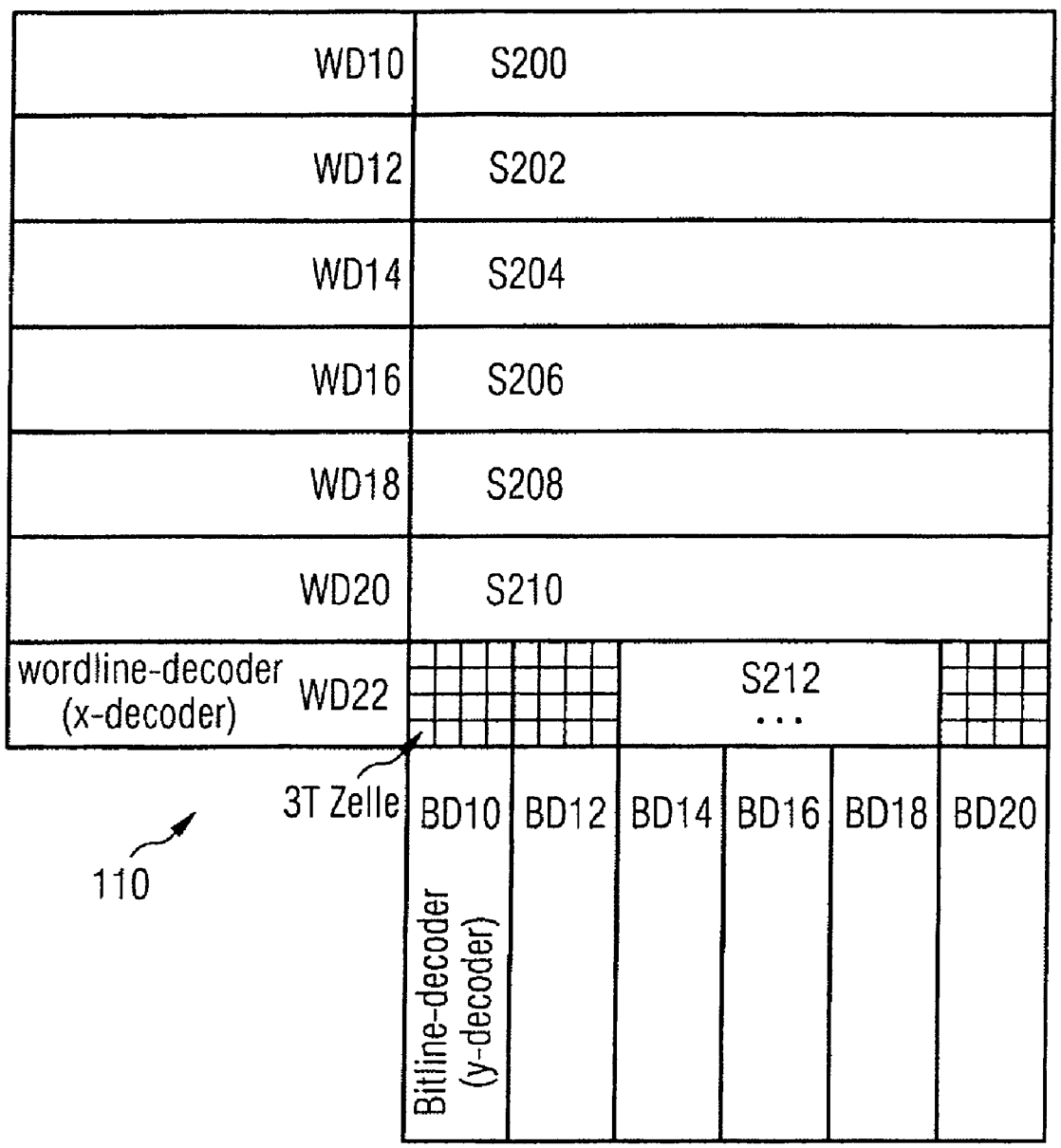
FIG. 11 shows a further exemplary embodiment with a plurality of collective electrodes.

FIG. 11 shows a memory unit 110 having seven collective electrodes S200 to S212 that are respectively assigned to one of seven word line decoders WD10 to WD22. A collective electrode S200 to S212 extends over three-transistor memory cells that are assigned to six different bit line decoders BD10 to BD20. The bit width of the bit line decoders BD10 to BD20, and of the word line decoders WD10 to WD22, is four bits in the exemplary embodiment. Consequently, 96 memory cells lie below a collective electrode S200 to S212 in the exemplary embodiment. Multiplexers that are not illustrated ensure that, depending on an address datum, only in each case one bit line decoder BD10 to BD20 and only in each case one word line decoder WD10 to WD22 are active.

In other exemplary embodiments, the memory unit 110 has a different organizational structure, such as a different number of word line decoders or bit line decoders or a different bit width of the decoders. In other exemplary embodiments, the bit width may be two bits, eight bits, sixteen bits or more.

The assignment of the collective electrodes S200 to S212 to a respective word line decoder WD10 to WD22 reduces the current consumption of the memory unit 110 when a potential is applied such as only to the collective electrode S200 to S212 having a word line decoder that is currently selected. By contrast, the non-selected collective electrodes are not connected to the operating potential or the ground potential.

The present invention specifies space-saving or chip-area-saving variants of three-transistor SRAM cells (3T) and of one-transistor SRAM cells (1T). The memory cells of the present invention may have applicability more for logic chips (e.g. microcontrollers, microprocessors, telecommunication chips, etc.) that have ever increasing use of larger on-chip memories, even in examples where typical SRAM memories may utilize more chip area compared with the digital logic.

The memory cells may have a capacitance shifted into the metallization. In particular, MIM capacitances with high-k dielectrics are distinguished by high area capacitance densities that may amount to up to 26 fF per square micrometer. (see P. Mazoyer et al., IITC2003, page 117). Capacitances in the range of 1 fF with less than 0.05 square micrometer may be possible, if an area capacitance of 25 fF per square micrometer is achieved. Moreover, concepts for further reducing the area requirement and for realizing collective electrodes are specified.

The materials used for the MIM capacitors are deposited and subjected to heat treatment at the temperatures of less than 450° C. (degrees Celsius) that are typical for metallizations, although the maximum values for the relative permittivity are not then attained for all the dielectrics, in particular not for all the dielectrics mentioned. In particular, the exemplary embodiments with collective electrodes can be applied both to storage capacitors having only two electrodes in each case and to storage capacitors having more than two electrodes or to a plurality of storage capacitors that are connected in parallel and arranged one above another per memory cell. In particular, the collective electrodes are the top electrodes.

The invention claimed is:

1. A memory cell, comprising:
 a first transistor, a second transistor and a third transistor, each transistor having a source, a gate and a drain;
 a storage capacitor having at least one metallic electrode, the metallic electrode including any of aluminum, an aluminum alloy, copper a copper alloy or combinations thereof; and
 wherein the source of the first transistor and the gate of the second transistor are electrically connected to the storage capacitor, and the drain of the third transistor is electrically connected to the source of the second transistor.

2. The memory cell of claim 1, where regions of the three transistors are arranged in a portion of a semiconductor substrate and the storage capacitor comprises more than two metallic electrodes each having a mutually different distance from the portion of the substrate having the regions of the transistors.

3. The memory cell of claim 2 comprising at least four electrodes each positioned at an increasing corresponding distance from the portion of the semiconductor substrate having regions at the transistors.

4. The memory cell of claim 3, comprising:
 an electrode group including the first electrode electrically connected with the third electrode; and
 a further electrode group including the second electrode electrically connected with the fourth electrode, where the electrodes of the electrode group have an substantially similar thickness being different from the Thickness of the electrode of the further electrode group.

5. The memory cell of claim 1, where the storage capacitor comprises at least two metallic electrodes arranged between two mutually adjacent planar metallization layers.

6. The memory cell of claim 1, where the electrodes have a quadrangular contour.

7. The memory cell of claim 1, where the capacitor comprises a capacitor dielectric including any of silicon oxide, silicon nitride, silicon carbide, aluminum oxide, tantalum oxide, hafnium oxide, zirconium oxide, lead zirconate titanate, or barium strontium titanate.

8. The memory cell of claim 7, where the capacitor dielectric comprises a material having a relative permittivity of greater than about 8 and has a thickness of around 50 nm to around 5 nm, the capacitor having a capacitance of around 10 fF to around 0.5 fF.

9. The memory cell of claim 1, comprising a generating unit configured to generate a charging signal to compensate for charge losses, the generating unit being synchronized by a processor clock of a processor.

10. The memory cell of claim 1, where the capacitor comprises a parallel electrode area arranged parallel to a substrate and at least one transverse electrode area arranged transversely with respect to the substrate, the at least one transverse electrode contributing to a total capacitance.

11. The memory cell of claim 1 where the capacitor comprises an electrode connected to an operating potential.

12. The memory cell of claim 1 where the capacitor comprises an electrode connected to a ground potential.

13. The memory cell of claim 1, comprising:
 a conductive section arranged between the capacitor and the substrate, the conductive section providing lateral current transport within a metallization layer in which it is arranged;
 a first electrically conductive connection between the conductive section and a connection of the first transistor;
 a further electrically conductive connection between the conductive section and a connection of the second transistor; and
 an electrically conductive connection between the conductive section and the capacitor.

14. The memory cell of claim 13, where the first electrically conductive connection and the second electrically conductive connection comprise a common connection.

15. The memory call of claim 13, where the first electrically conductive connection and the second electrically conductive connection comprise an elongated hole connection.

16. A memory unit comprising:
 a plurality of memory cells each having a first transistor, a second transistor, and a third transistor, each transistor having a source, a gate, and a drain; and
 a storage capacitor, the storage capacitor including at least one metallic electrode, the metallic electrode including any of aluminum, an aluminum alloy, copper a copper alloy or combinations thereof wherein the source of the first transistor and the gate of the second transistor are electrically connected to the storage capacitor, and the drain of the third transistor is electrically connected to the source of the second transistor.

17. The memory unit of claim 16, where electrodes for different memory cells comprise a collective electrode.

18. The memory unit of claim 17, where the collective electrode is arranged in a word line direction as an electrode for a plurality of memory cells on different bit lines.

19. The memory unit of claim 18, where the number of word lines associated with the collective electrode is substantially the same as the bit width of a word line decoder of the memory unit.

20. The memory unit of claim 17, where the collective electrode is arranged in a bit line direction as an electrode for a plurality of memory cells on different word lines.

21. The memory unit of claim 20, where the number of bit lines associated with the collective electrode is substantially the same as the bit width of a bit line decoder of the memory unit.

22. The memory unit of claim 17, where the collective electrode is arranged as an electrode in a word line direction for memory cells on a plurality of bit lines and in a bit line direction for memory calls on a plurality of word line.

23. The memory unit of claim 17, where the collective electrode is connected outside a plurality of memory cells without local electrically conductive connections for individual memory cells.

24. The memory unit of claim 16, where the storage capacitors for the memory cells are arranged at substantially the same distance from the transistors of a corresponding memory cell.

25. The memory unit of claim 17, where the storage capacitors for different memory cells are arranged at a different distance from the transistors of a corresponding memory cell.

26. The memory unit of claim 25, where the storage capacitors of mutually adjacent memory cells overlap.

27. The memory unit of claim 16, where the capacitor of a memory cell is arranged closer to a semiconductor substrate of the memory unit than a bit line for driving the memory cell.

28. A memory cell, comprising:
A first transistor, a second transistor, and a third transistor, each transistor having a source, a gate, and a drain, regions of each transistor being arranged in a portion of a semiconductor substrate; and
a storage capacitor coupled to the plurality of transistors, the storage capacitor having a metallic electrode wherein the source of the first transistor and the gate of the second transistor are electrically connected to the storage capacitor, and the drain of the third transistor is electrically connected to the source of the second transistor.

29. The memory cell of claim 28, where the storage capacitor comprises a plurality of metallic electrodes each having a mutually different distance from the portion of the substrate having the regions of the transistors.

30. The memory cell of claim 29, comprising:
an electrode group including a first electrode electrically connected with the second electrode; and
a further electrode group including the third electrode electrically connected with the fourth electrode,
where the electrodes of the electrode group have an substantially similar thickness being different from the thickness of the electrode of the further electrode group, the third electrode being at a great distance from the substrate than the second electrode.

31. The memory cell of claim 29, comprising at least two metallic electrodes arranged between two mutually adjacent planar metallization layers.

32. The memory cell of claim 29, where the capacitor has a capacitance of around 10 fF to around 0.5 fF.

* * * * *

UNITED STATES PATENT AND TRADEMARK OFFICE
CERTIFICATE OF CORRECTION

PATENT NO.         : 7,440,334 B2                                        Page 1 of 1
APPLICATION NO.    : 11/387490
DATED              : October 21, 2008
INVENTOR(S)        : Hans-Joachim Barth et al.

It is certified that error appears in the above-identified patent and that said Letters Patent is hereby corrected as shown below:

<u>In the Claims</u>

In columns 9-10, in claim 4, line 6, after "group have" delete "an" and substitute --a-- in its place.

In columns 9-10, in claim 4, line 8, before "of the electrode" delete "Thickness" and substitute --thickness-- in its place.

In column 11, in claim 22, line 4, after "plurality of word" delete "line." and substitute --lines.-- in its place.

In column 12, in claim 30, line 6, after "group have" delete "an" and substitute --a-- in its place.

In column 12, in claim 30, line 9, after "electrode being at a" delete "great" and substitute --greater-- in its place.

Signed and Sealed this

Twenty-fourth Day of March, 2009

JOHN DOLL
*Acting Director of the United States Patent and Trademark Office*

UNITED STATES PATENT AND TRADEMARK OFFICE
CERTIFICATE OF CORRECTION

PATENT NO.           : 7,440,334 B2
APPLICATION NO.  : 11/387490
DATED                    : October 21, 2008
INVENTOR(S)          : Hans-Joachim Barth et al.

It is certified that error appears in the above-identified patent and that said Letters Patent is hereby corrected as shown below:

In the Claims

In columns 9-10, in claim 4, line 1, after "group have" delete "an" and substitute --a-- in its place.

In columns 9-10, in claim 4, line 3, before "of the electrode" delete "Thickness" and substitute --thickness-- in its place.

In column 11, in claim 22, line 15, after "plurality of word" delete "line." and substitute --lines.-- in its place.

In column 12, in claim 30, line 22, after "group have" delete "an" and substitute --a-- in its place.

In column 12, in claim 30, line 25, after "electrode being at a" delete "great" and substitute --greater-- in its place.

This certificate supersedes the Certificate of Correction issued March 24, 2009.

Signed and Sealed this

Fourteenth Day of April, 2009

JOHN DOLL
*Acting Director of the United States Patent and Trademark Office*

UNITED STATES PATENT AND TRADEMARK OFFICE
CERTIFICATE OF CORRECTION

PATENT NO. : 7,440,334 B2  Page 1 of 1
APPLICATION NO. : 11/387490
DATED : October 21, 2008
INVENTOR(S) : Hans-Joachim Barth et al.

It is certified that error appears in the above-identified patent and that said Letters Patent is hereby corrected as shown below:

On the Title Page Item (73) Assignee: "Infineon Technologies" should be

--Infineon Technologies AG--.

Signed and Sealed this

Thirteenth Day of October, 2009

David J. Kappos
*Director of the United States Patent and Trademark Office*